United States Patent
Serizawa et al.

(10) Patent No.: US 7,800,696 B2
(45) Date of Patent: Sep. 21, 2010

(54) DELAY CIRCUIT AND VIDEO SIGNAL PROCESSING CIRCUIT USING THE SAME

(75) Inventors: Shunsuke Serizawa, Gunma (JP); Tetsuo Sakata, Gunma (JP); Masato Onaya, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 1049 days.

(21) Appl. No.: 11/470,929

(22) Filed: Sep. 7, 2006

(65) Prior Publication Data

US 2007/0076124 A1    Apr. 5, 2007

(30) Foreign Application Priority Data

Sep. 30, 2005    (JP) .............................. 2005-286081

(51) Int. Cl.
*H04N 9/66*    (2006.01)
*H03H 11/26*    (2006.01)

(52) U.S. Cl. ..................... 348/639; 348/638; 348/659; 327/271; 327/272; 327/277; 327/278; 327/284

(58) Field of Classification Search ................ 348/726, 348/727, 663–670, 638–640, 713, 659–661, 348/645–646; 327/261–290, 392–402
See application file for complete search history.

(56) References Cited

U.S. PATENT DOCUMENTS 5,144,173 A * 9/1992 Hui ............................. 327/277
5,614,855 A * 3/1997 Lee et al. ..................... 327/158
5,627,488 A * 5/1997 Tanzawa et al. ............. 327/261
6,404,258 B2 * 6/2002 Ooishi ......................... 327/278

FOREIGN PATENT DOCUMENTS

JP    9-191472    7/1997

* cited by examiner

*Primary Examiner*—M. Lee
(74) *Attorney, Agent, or Firm*—Fish & Richardson P.C.

(57) ABSTRACT

A delay circuit acquiring an output signal delayed from an input signal, comprising: a switched capacitor group that includes a plurality of switched capacitor units, wherein each of the plurality of switched capacitor units has a charging MOS transistor and a discharging MOS transistor, and a capacitive element which is connected to sources of the charging and the discharging MOS transistors; and a switching control unit that performs on/off control of the charging and the discharging of the MOS transistors, to cause each of the capacitive elements to be charged in sequence based on the input signal, and that, upon causing the each of the capacitive elements to be charged in sequence based on the input signal, causes the capacitive element charged last time to be discharged, to allow the output signal to be output in sequence.

4 Claims, 11 Drawing Sheets

|   |   | T0 | T1 | T2 | T3 | T4 | T5 | T6 |
|---|---|---|---|---|---|---|---|---|
| (A) | IN | D0 | D1 | D2 | D3 | D4 | D5 | |
| (B) | SW0 | ⎺⎺ | | | | | | |
| (C) | SW1 | | ⎺⎺ | | | | | |
| (D) | SW2 | | | ⎺⎺ | | | | |
| (E) | SW3 | | | | ⎺⎺ | | | |
| (F) | SW4 | | | | | ⎺⎺ | | |
| (G) | N1 | ON | | | OFF | | | |
| (H) | N2·N4 | OFF | ON | | OFF | | | |
| (I) | N3·N5 | OFF | | ON | | OFF | | |
| (J) | N6·N8 | OFF | | | ON | OFF | | |
| (K) | N7 | OFF | | | | | ON | OFF |
| (L) | C1 | D0 | | | | | | |
| (M) | C2 | | D1 | | | | | |
| (N) | C3 | | | D2 | | | | |
| (O) | C4 | | | | D3 | | | |
| (P) | OUT | -- | D0 | D1 | D2 | D3 | D4 | |

FIG. 5

DELAY CIRCUIT AND VIDEO SIGNAL PROCESSING CIRCUIT USING THE SAME

CROSS-REFERENCE TO RELATED APPLICATION

This application claims the benefit of priority to Japanese Patent Application No. 2005-286081, filed Sep. 30, 2005, of which full contents are incorporated herein by reference.

BACKGROUND OF THE INVENTION

1. Field of the Invention

The present invention relates to a delay circuit and a video signal processing circuit using the delay circuit.

2. Description of the Related Art

Analog color television systems which are employed in the world are broadly divided into three systems, i.e., NTSC (National Television Standards Committee) system employed mainly in Japan and North/Central America, PAL (Phase Alternation by Line) system employed mainly in the West European countries, and SECAM (SEquential Couleur A Memoire) system employed mainly in the East European countries. The NTSC system is a system of an interlaced scanning of 30 frames/sec, each frame having 525 horizontal scanning lines, with a horizontal scanning frequency at 15.75 kHz and with a vertical scanning frequency at 60 Hz. The PAL system is a system of an interlaced scanning of 25 frames/sec, each frame having 625 horizontal scanning lines, each of which is phase-inverted. The SECAM system is a system of an interlaced scanning of 25 frames/sec, each frame having 625 horizontal scanning lines. In this manner, all the systems of the NTSC, PAL, and SECAM basically perform the interlaced scanning and, as shown in FIG. 8, transmit one screen by two separate scan of one frame for an odd-numbered field and for an even-numbered field. The one frame consists of the odd-numbered field and the even-numbered field. More specifically, in the interlaced scanning, all the scanning lines in the odd-numbered field are scanned every alternate scanning line from top to bottom of the screen. The scanning of the last scanning line in the odd-numbered field is then discontinued halfway and all the scanning lines in the even-numbered field are scanned from top to bottom as if the interstices of all the scanning lines in the odd-numbered field are filled up.

In the NTSC, PAL, and SECAM systems, video signals of R (red), G (green), and B (blue) captured as an image by a television camera are not transmitted in their original forms, but there is employed a scheme of converting the video signals captured as an image into a luminance signal Y representing brightness of the screen and a chroma signal C representing the level of shading of the screen color, and further of transmitting a composite signal SC which is obtained by compositing the luminance signal Y and the chroma signal C. FIG. 9 shows examples of waveforms of a chroma signal C, a luminance signal Y, and a composite signal SC. The chroma signal C shown in (A) of FIG. 9 is a signal obtained by converting two color-difference signals R-Y and B-Y, which are obtained by subtracting the luminance signal Y from the R signal and B signal, respectively, into mutually orthogonal I-Q signal (case of NTSC system) or U-V signal (case of PAL system) and by compositing and amplitude modulating the signals. The chroma signal C includes a color burst signal BS and a carrier chrominance signal CA. Note that the color burst signal BS is a signal used as a reference of the phase and amplitude of the carrier chrominance signal CA, and that the carrier chrominance signal CA is a signal with a phase thereof indicative of a hue and with an amplitude thereof indicative of chroma. The luminance signal Y shown in (B) of FIG. 9 includes a horizontal synchronizing signal HSYNC and a luminance signal YA. Note that the horizontal synchronizing signal HSYNC is a signal indicative of the start of a single scanning line in the horizontal direction, and that the period between the two adjacent horizontal synchronizing signals HSYNC is called "1H period (one horizontal scanning period: about 64 μsec)". The luminance signal YA is a signal indicative of the details of the luminance. The composite signal SC shown in (C) of FIG. 9 is a composite of the chroma signal C shown in (A) of FIG. 9 and the luminance signal Y shown in (B) of FIG. 9. More specifically, the composite signal SC has a waveform obtained by superimposing the color burst signal BS of the chroma signal C on the back porch of the luminance signal Y and by superimposing the carrier chrominance signal CA of the chroma signal C on the luminance signal YA.

By the way, the overseas PAL and SECAM systems require the video signal processing circuit on the receiving side to delay color-difference signals R-Y and B-Y demodulated from video signals received at the antenna by 1H period and to combine the 1H-period delayed signals with the most recent color-difference signals R-Y and B-Y, to thereby eliminate distortions arising on transmission paths and to thereby match the color-difference information of all the scanning lines by line correction. The mainstream of such a circuit for delaying by 1H period (hereinafter, referred to as a 1H-delay circuit) has hitherto been of a type using CCD (Charged Coupled Device) delay elements (see, e.g., Japanese Patent Application Laid-Open Publication No. 1997-191472).

However, although the video signal processing circuit except the CCD delay element for 1H-delay circuit has hitherto been designed and manufactured exclusively by a bipolar process capable of handling analog signal easily, a shift to the next-generation BiCMOS process capable of handling both the bipolar and CMOS would enable the video signal processing circuit inclusive of the CCD delay element to be made into one chip for low-cost designing and manufacturing. It is also proposed to use as the 1H-delay circuit instead of the CCD delay element a "switched capacitor circuit" that is more inexpensive than the CCD delay element and that has hitherto been used dedicatedly as an analog filter.

FIG. 10 shows a configuration of a conventional delay circuit using the switched capacitor circuit. Note that although the delay circuit shown in FIG. 10 includes two switched capacitor units for simplification of explanation, the number of the switched capacitor units may vary depending on the delay time required.

NMOS transistors M1 and M2 have their respective source electrodes that are connected in common to a capacitive element C1 to make up a single switched capacitor unit 703a. Similarly, NMOS transistors M3 and M4 have their respective source electrodes that are connected in common to a capacitive element C2 to make up a single switched capacitor unit 703b. Note that an input voltage VIN to be delayed is applied to drain electrodes of the NMOS transistors M1 and M3, whilst the drain electrodes of the NMOS transistors M2 and M4 are connected to a non-inverting input terminal of a voltage follower 702.

That is, in the switched capacitor unit 703a, the NMOS transistor M1 functions as a charging MOS transistor for charging the capacitive element C1 based on an input signal IN, and the NMOS transistor M2 functions as a discharging MOS transistor for discharging the capacitive element C1 so that an output signal OUT is output. In the switched capacitor unit 703b, the NMOS transistor M3 functions as a charging MOS transistor for charging the capacitive element C2 based on the input signal IN, and the NMOS transistor M4 functions as a discharging MOS transistor for discharging the capacitive element C2 so that the output signal OUT is output.

Such a delay circuit further includes a switching control circuit 701 for performing on/off control of gate electrodes of the NMOS transistors M1 to M4. Note that the switching control circuit 701 inputs a switch signal SW1 to a gate electrode of the NMOS transistor M1, inputs switch signals SW2 to gate electrodes of the NMOS transistors M2 and M3, and inputs a switch signal SW3 to a gate electrode of the NMOS transistor M4. Such a configuration allows the voltage follower 702 to output an output voltage VOUT that is delayed from the input voltage VIN by a period of switching cycle of the NMOS transistors M1 to M4.

FIG. 11 is timing chart showing operation examples of the delay circuit shown in FIG. 10. Note that the level of the input voltage VIN is assumed to shift from D0 to D4 in respective periods segmented by times T0 to T5 (see (A) of FIG. 11), and that respective periods segmented by times T0 to T5 are correlated with the period of switching cycle of the NMOS transistors M1 to M4.

First, at time T0, the switching signals SW1 to SW3 input to the gate electrodes of the NMOS transistors M1 to M4 become at low, high, and low, respectively, and keep those states till time T1 (see (B) to (D) of FIG. 11). That is, at time T0, the NMOS transistors M1 and M4 are turned off and the NMOS transistors M2 and M3 are turned on, being kept in those states till time T1 (see (E) to (G) of FIG. 11). Thus, there is formed a charging path of the NMOS transistor M3 and the capacitive element C2 in the period of time T0 to T1, with the result that electric charge corresponding to the level D0 of the input voltage VIN in such a period is charged into the capacitive element C2 via the NMOS transistor M3, to thereby cause information on the level D0 of the input voltage VIN to be held (see (I) of FIG. 11). On the other hand, there is formed a discharging path of the NMOS transistor M2 and the capacitive element C1, while any electric charge is not yet held on the capacitive element C1 (see (H) of FIG. 11) with the output voltage VOUT remaining uncertain (see (J) of FIG. 11).

Next, at time T1, the switch signals SW1 to SW3 input to the gate electrodes of the NMOS transistors M1 to M4 become at high, low, and high, respectively, and keep those states till time T2 (see (B) to (D) of FIG. 11). That is, at time T1, the NMOS transistors M1 and M4 are turned on and the NMOS transistors M2 and M3 are turned off, being kept in those states till time T2 (see (E) to (G) of FIG. 11). Thus, in the period of time T1 to T2, there is formed a charging path of the NMOS transistor M1 and the capacitive element C1, with the result that electric charge corresponding to the level D1 of the input voltage VIN in such a period is charged into the capacitive element C1 via the NMOS transistor M1, to thereby cause information on the level D1 of the input voltage VIN to be held (see (H) of FIG. 11). On the other hand, there is formed a discharging path of the NMOS transistor M4 and the capacitive element C2, with the result that electric charge held on the capacitive element C2 is discharged to thereby cause the input voltage VIN of the level D0 corresponding to the electric charge to be read out (see (I) of FIG. 11) and to be applied to the non-inverting input terminal of the voltage follower 702. This allows the voltage follower 702 to output the output voltage VOUT that is delayed from the input voltage VIN of the level D0 by a period of switching cycle of the NMOS transistors M1 to M4 (see (J) of FIG. 11). Then, afterward, the above operation is repeated in each of periods of time T2 to T3, time T3 to T4, and time T4 to T5.

By the way, the NMOS transistors M1 to M4 exhibit in general a so-called well-type sectional structure as shown in FIG. 12. That is, polycrystalline polysilicon 13 is formed on a p-type silicon substrate 16 via silicon dioxide ($SiO_2$) 14 for gate insulating film, on top of which polycrystal polysilicon 13 a gate 18 is formed. On the p-type silicon substrate 16 is formed an n+ region (region with a high n-type impurity density) 15, on top of which a drain 17 and a source 19 are formed. Note that reference numerals 10, 11, and 12 denote a drain electrode, a gate electrode, and a source electrode, respectively, extending from the drain 17, the gate 18, and the source 19, respectively. In the case of the PMOS transistor, on the other hand, the conduction types of constituent parts of the NMOS transistor shown in FIG. 12 are inverted.

FIG. 13 is a diagram for explaining, using the general sectional structure of the NMOS transistor shown in FIG. 12, a layout and various connections of the switched capacitor circuit unit (NMOS transistors M1 to M4) making up the delay circuit shown in FIG. 10. Note that although a p-type silicon substrate 16a of the switched capacitor unit 703a and a p-type silicon substrate 16c of the switched capacitor unit 703b are shown separately, they are formed on the same silicon wafer. As shown in FIG. 13, with respect to the switched capacitor unit 703a, the NMOS transistors M1 and M2 are disposed adjacent to each other, with their sources 19a and 19b being common. Similarly, with respect to the switched capacitor unit 703b, the NMOS transistors M3 and M4 are disposed adjacent to each other, with their sources 19c and 19d being common. In this manner, generally, the sources 19a and 19b as well as the sources 19c and 19d are respectively disposed in common to achieve integration in terms of layout design (see, e.g., Japanese Patent Laid-Open Publication No. 1997-191472).

Since different p and n conduction types are disposed adjacent to each other between the source and p-type silicon substrate as well as between the drain and the p-type silicon substrate, there potentially exist their respective parasitic capacitances Csb (source-to-substrate) and Cdb (drain-to-substrate). Note that the parasitic capacitances Csb and Cdb are represented as the following equation 1 using the transistor width W and the drain length Ld.

$$Csb = Cdb = (W+\alpha) \times (Ld+\alpha) \quad (1)$$

where α is a coefficient set for each transistor.

In the switched capacitor unit 703a, as shown in FIG. 13, a parasitic capacitance Cdb1 exists between a drain 17a and the p-type silicon substrate 16a, and a parasitic capacitance Cdb2 exists between a drain 17b and the p-type silicon substrate 16a. In the switched capacitor unit 703b, a parasitic capacitance Cdb3 exists between a drain 17c and the p-type silicon substrate 16b, and a parasitic capacitance Cdb4 exists between a drain 17d and the p-type silicon substrate 16b. Note that a parasitic capacitance Csb1 exists between the source 19a, 19b and the p-type silicon substrate 16a, and in the same manner, a parasitic capacitance Csb2 exists between the source 19c, 19d and the p-type silicon substrate 16b, while that a capacitive element C1 is connected to a source electrode 12a, and a capacitive element C2 is connected to a source electrode 12c. That is, it can be said that the parasitic capacitance Csb1 and the capacitive element C1 are connected in parallel and that the parasitic capacitance Csb2 and the capacitive element C2 are connected in parallel. In this case, the capacitive elements C1 and C2 are of the order of picofarad (pF) while the parasitic capacitances Csb1 and Csb2 are of the order of femtofarad (fF) in general, which may be negligible. Therefore, only the drain-to-substrate parasitic capacitances Cdb1 to Cdb4 may be taken into consideration in the delay circuit shown in FIG. 13.

A multiplicity of switched capacitor units 703a and 703b need to be disposed depending on the delay time required as the delay circuit. This results in increased number of drain-to-substrate parasitic capacitances Cdb1 to Cdb4, and combined capacitances in their parallel connections appear on signal paths of the delay circuit. The resultant combined capacitances may then induce problems of dulled final output waveforms of the delay circuit and thus of poor delay characteristics.

SUMMARY OF THE INVENTION

In order to solve the above problems, according to a major aspect of the present invention there is provided a delay circuit acquiring an output signal delayed from an input signal, comprising: a switched capacitor group that includes a plurality of switched capacitor units, wherein each of the plurality of switched capacitor units has a charging MOS transistor and a discharging MOS transistor, and a capacitive element which is connected to sources of the charging and the discharging MOS transistors and which is charged/discharged by turning on/off gates of the charging and the discharging MOS transistors, and wherein the plurality of switched capacitor units are connected such that the input signal is input in common to each of drains of the charging MOS transistors and such that the capacitive elements are charged as well as such that the capacitive elements are discharged to allow the output signal to be output from each of drains of the discharging MOS transistors; and a switching control unit that performs on/off control of each of gates of the charging and the discharging MOS transistors, to cause each of the capacitive elements to be charged in sequence based on the input signal, and that, upon causing the each of the capacitive elements to be charged in sequence based on the input signal, causes the capacitive element charged last time to be discharged, to allow the output signal to be output in sequence, wherein with respect to the two adjacent switched capacitor units of the plurality of switched capacitor units, the respective charging MOS transistors are adjacent to each other and the respective discharging MOS transistors are adjacent to each other, and drains of the respective charging MOS transistors are common and drains of the respective discharging MOS transistors are common.

According to the present invention there can be provided a delay circuit utilizing the switched capacitors to alleviate drain-to-substrate parasitic capacitances, and a video signal processing circuit using the delay circuit.

BRIEF DESCRIPTION OF THE DRAWINGS

For more thorough understanding of the present invention and advantages thereof, the following description should be referenced in conjunction with the accompanying drawings, in which:

FIG. 5 shows operation timing of major signals in a 1H-delay circuit according to an embodiment of the present invention;

DETAILED DESCRIPTION OF THE INVENTION

At least the following details will become apparent from the descriptions of this specification and of the accompanying drawings.

<Configuration of Television Receiving System>

Figure 1:
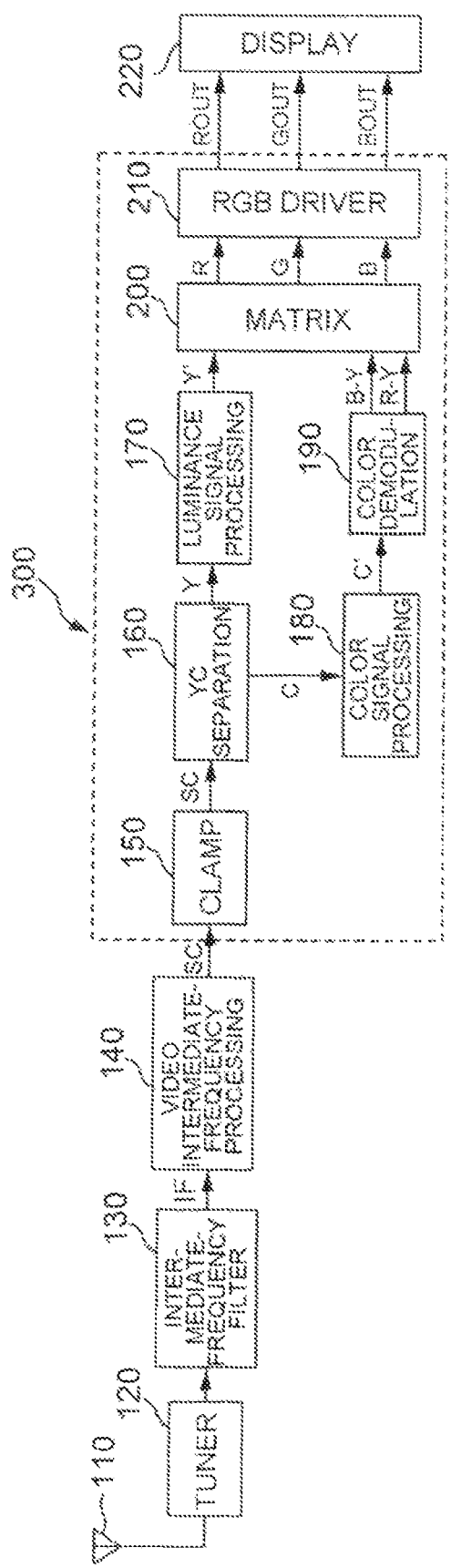
FIG. 1 shows a configuration of a television receiving system according to an embodiment of the present invention.

FIG. 1 is a configuration diagram of a television receiving system according to the present invention. A tuner 120 is a front-end processing circuit that extracts signals of a channel to be received among video signals of television broadcasting which are received at an antenna 110, and that thereafter amplifies and outputs the extracted signals. Note that the video signals of television broadcasting conform to the PAL system or the SECAM system and have three-primary-color (R, G, B) information on colors captured as an image by a television camera.

An intermediate-frequency filter 130 is a filter that extracts only intermediate-frequency signals IF from signals output from the tuner 120.

A video intermediate-frequency processing circuit 140 is a circuit that detects the intermediate-frequency signals IF extracted by the intermediate-frequency filter 130 to extract a composite signal SC.

A clamping circuit 150 is a circuit for clamping at a predetermined level the pedestal level of the composite signal SC extracted by the video intermediate-frequency processing circuit 140.

A YC separating circuit 160 is a circuit that synchronously separates the composite signal SC input from the clamping circuit 150 into a luminance signal Y and a chroma signal C.

A luminance signal processing circuit 170 is a circuit that performs contract adjustment or blanking adjustment of the luminance signal Y input from the YC separating circuit 160.

A color signal processing circuit 180 is a circuit that performs processings such as gain adjustment and color killing for each channel, of the chroma signals C input from the YC separating circuit 160.

A color demodulating circuit 190 is a circuit that demodulates color-difference signals R-Y and B-Y mainly based on chroma signals C' subjected to various processings by the color signal processing circuit 180.

A matrix circuit 200 is a circuit that combines the color-difference signals R-Y and B-Y demodulated by the color demodulating circuit 190 with a luminance signal Y' subjected to various processings by the luminance signal processing circuit 170 to restore a video signal consisting of three signals, i.e., R signal, G signal, and B signal.

An RGB driver 210 is a drive circuit that generates driving signals ROUT, GOUT, and BOUT for reproducing a desired color picture on a display 220, based on three signals, i.e., R signal, G signal, and B signal input from the matrix circuit 200.

<Configuration of Video Signal Processing Circuit>

Figure 2:
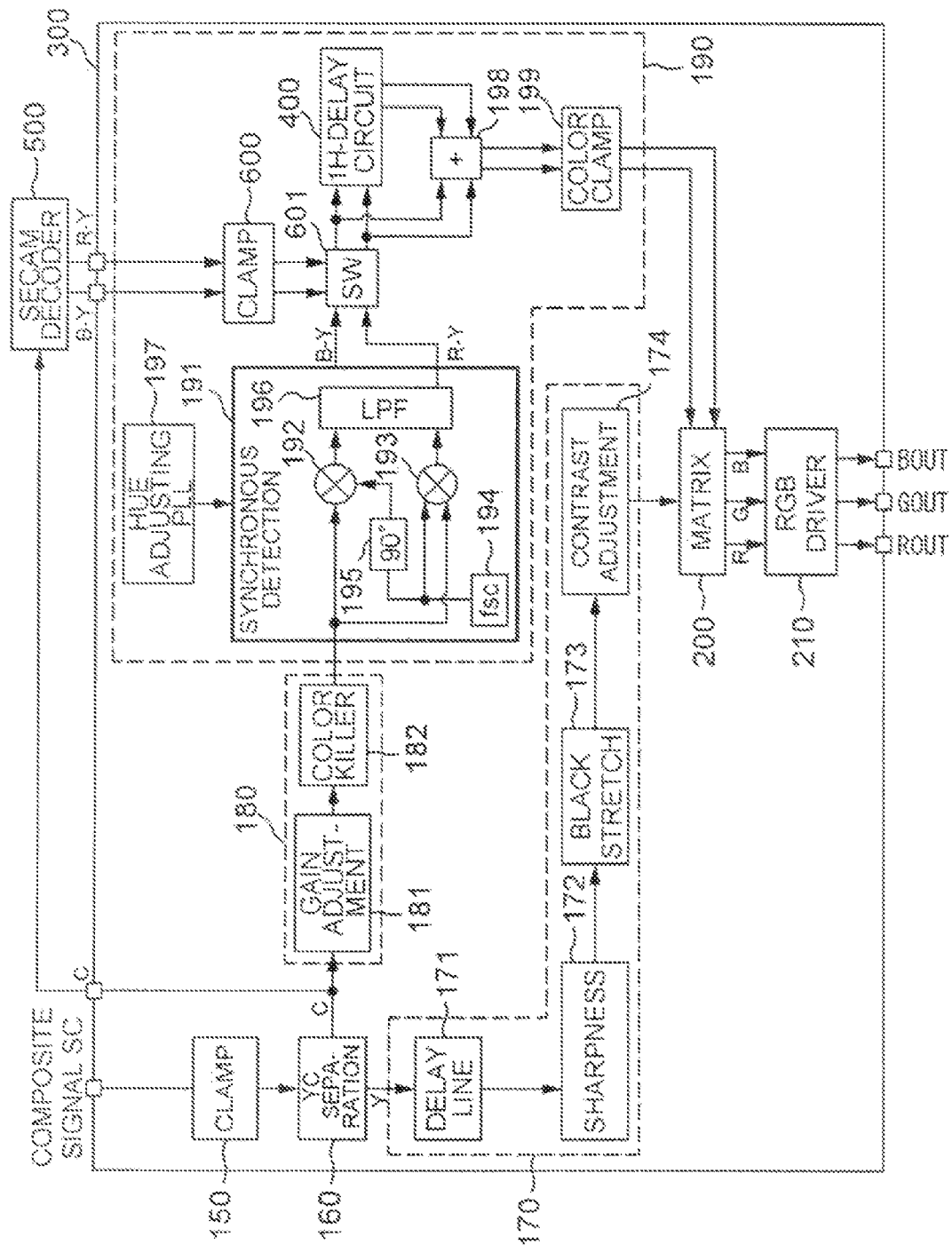
FIG. 2 shows a configuration of a video signal processing circuit according to an embodiment of the present invention.

FIG. 2 is a configuration diagram of a video signal processing circuit 300 for analog color television having a 1H-delay circuit 400 according to an embodiment of a "delay circuit" of the present invention. Note that the video signal processing circuit 300 is also capable of processing video signals under SECAM system, with externally disposed with a SECAM decoder 500, while being mainly directed to processing of video signals under PAL system. Note that the video signal processing circuit 300 may be embodied including the SECAM decoder 500 for integration. The video signal processing circuit 300 is an integrated circuit designed and manufactured by the BiCMOS process capable of handling both the bipolar and CMOS.

Although the video signal processing circuit 300 is integrated into one chip including the clamping circuit 150, the YC separating circuit 160, the luminance signal processing circuit 170, the color signal processing circuit 180, the color demodulating circuit 190, the matrix circuit 200, the RGB driver 210 as shown in FIG. 1, it may be integrated into one chip additionally including the tuner 12, the intermediate-frequency filter 130, and the video intermediate-frequency processing circuit 140.

The clamping circuit 150, the YC separating circuit 160, the matrix circuit 200, and the RGB driver 210 are the same as the above and therefore will not again be described.

The luminance signal processing circuit 170 includes a delay line 171, a sharpness adjusting unit 172, a black stretch processing unit 173, and a contrast adjusting unit 174. The delay line 171 is a circuit that delays the luminance signal Y to adjust the time difference from the demodulation processing of the chroma signal C. The sharpness adjusting unit 172 performs contour correction processing of images based on the luminance signal Y. The black stretch processing unit 173 performs processing for enhancing the resolution of dark areas of images based on the luminance signal Y to thereby prevent occurrence of a phenomenon in which black in an image gets poor. The contrast adjusting unit 174 performs processing for adjusting the difference between light and darkness of the images based on the luminance signal Y. That is, the sharpness adjusting unit 172, the black stretch processing circuit 173, and the contrast adjusting unit 174 serve as so-called effectors.

The color signal processing circuit 180 includes a gain adjusting unit 181 and a color killer circuit 182. The gain adjusting unit 181 performs processing for adjusting a chroma signal C to a proper level depending on a channel, with reference to a color burst signal SC included in the chroma signal C. The color killer circuit 182 performs processing for detecting the color burst signal SC so as not to send a carrier chrominance signal CA to the color demodulating circuit 190, by reason that noise arises when the color demodulating circuit 190 operates during the black-and-white broadcasting.

The color demodulating circuit 190 includes a synchronous detecting circuit 191, a hue adjusting PLL (Phase-Locked Loop) circuit 197, the 1H-delay circuit 400, an adder 198, a color clamping circuit 199.

Figure 3:
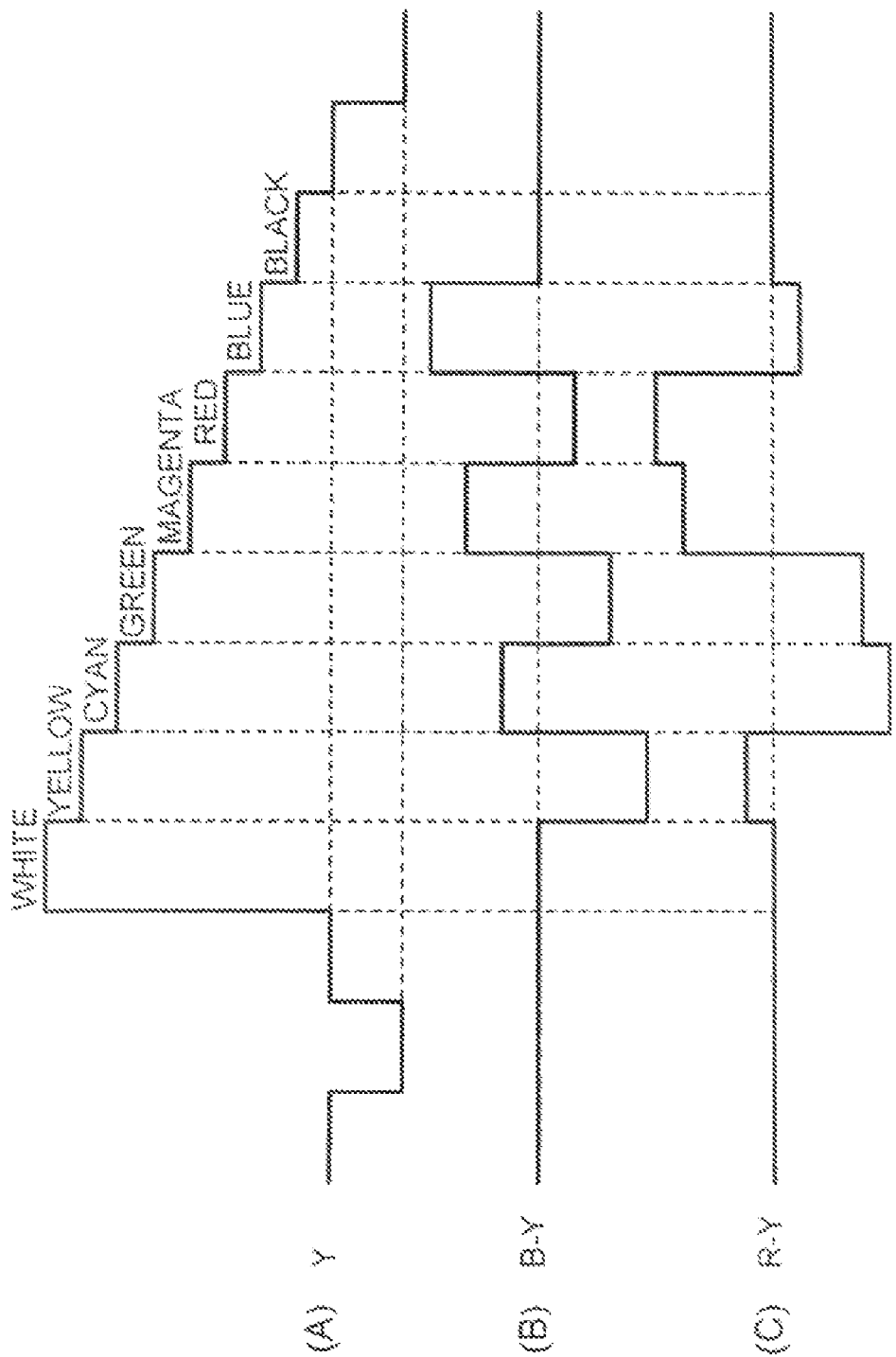
FIG. 3 shows examples of waveforms of color-difference signals B-Y and R-Y, and a waveform of a luminance signal Y corresponding thereto, according to the present invention.

The synchronous detecting circuit 191 is directed to processing of the chroma signal C in the case of the PAL system and performs synchronous detection by multiplying a sub-carrier signal fsc generated in an oscillatory manner in a sub-carrier signal oscillator 194, by a chroma signal C' input from the color signal processing circuit 180, to output color-difference signals B-Y and R-Y simultaneously. More specifically, the color-difference signal B-Y is detected and demodulated by phase-shifting the sub-carrier signal fsc by 90 degrees with the use of a phase shifter 195, then by multiplying the 90-degree phase-shifted sub-carrier signal fsc by the chroma signal C' in a multiplier 192. The color-difference signal R-Y is detected and demodulated by multiplying the sub-carrier signal fsc by the chroma signal C' in a multiplier 193. Note that high-frequency components are included in the color-difference signals B-Y and R-Y detected and demodulated by the multipliers 192 and 193, respectively. For this reason, an LPF (Low Pass Filter) 196 is ordinarily removes the high-frequency components. Examples of waveforms are shown in FIG. 3 of the color-difference signals B-Y and R-Y detected and demodulated by the synchronous detecting circuit 191, and of the luminance signal Y corresponding thereto.

The hue adjusting PLL circuit 197 is a PLL circuit that adjusts the hue of the chroma signal C' by a PLL control for matching the phase of an oscillation clock signal generated by an oscillation circuit (not shown) with which a part of the PLL circuit is configured, to the phase of a color burst signal SC included in the chroma signal C.

The SECAM decoder 500 is an external circuit directed to processing of the chroma signal C in the case of the SECAM system, which inputs a chroma signal C subjected to the YC separating circuit 160, and outputs color-difference signals B-Y and R-Y detected and demodulated from the chroma signal C. The detected and demodulated color-difference signals B-Y and R-Y are then input to the video signal processing circuit 300. Note that unlike the synchronous detecting circuit 191 in the case of the PAL system, the SECAM decoder 500 outputs the color-difference signals B-Y and R-Y alternately every 1H period in conformity with the SECAM system. That is, the SECAM decoder 500 does not output the color-difference signal R-Y when outputting the color-difference signal B-Y, whereas the SECAM decoder 500 does not output the color-difference signal B-Y when outputting the color-difference signal R-Y.

A clamping circuit 600 is a circuit that clamps the color-difference signals B-Y and R-Y input from the SECAM decoder 500 at a predetermined level.

A switching circuit 601 is a circuit that selects any one of: the color-difference signals B-Y and R-Y in the case of the PAL system, which are input simultaneously from the synchronous detecting circuit 191; or the color-difference signals B-Y and R-Y in the case of the SECAM system, which are input alternately from the clamping circuit 600, in conformity with the analog color television system of the received video signals.

Figures 10, 11:
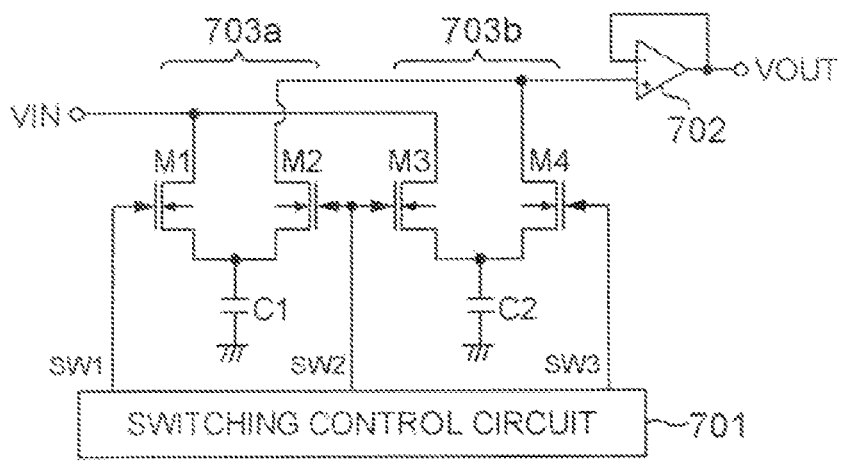
FIG. 10 is an explanatory diagram of a configuration of a conventional delay circuit using a switched capacitor circuit.
FIG. 11 shows timing of main signals in a conventional delay circuit using a switched capacitor circuit.

The 1H-delay circuit 400 is a delay circuit that delays the color-difference signals B-Y and R-Y input from the switching circuit 601, by 1H period (one horizontal scanning period: about 64 μsec). Note that the 1H period is a period between two adjacent horizontal synchronizing signals HSYNC as shown in FIG. 11.

The adder 198 is a circuit that adds together the color-difference signals B-Y and R-Y input from the switching circuit 601 and the color-difference signals B-Y and R-Y delayed 1H period by the 1H-delay circuit 400. This adding eliminates distortions of the chroma signals C on the transmission paths, and the line correction matches the color-difference information of all the scanning lines. Note that the result of adding of the adder 198 is clamped at a predetermined level by the color clamping circuit 199 to thereafter be input to the matrix circuit 200. As a result, the matrix circuit 200 regenerates three-primary-color (R, G, B) information on colors captured as an image by the television camera, based on the luminance signal Y' input from the luminance signal processing circuit 170 and on the color-difference signals B-Y and R-Y input from the color clamping circuit 199.

<Configuration of 1H-Delay Circuit>

Figure 4:
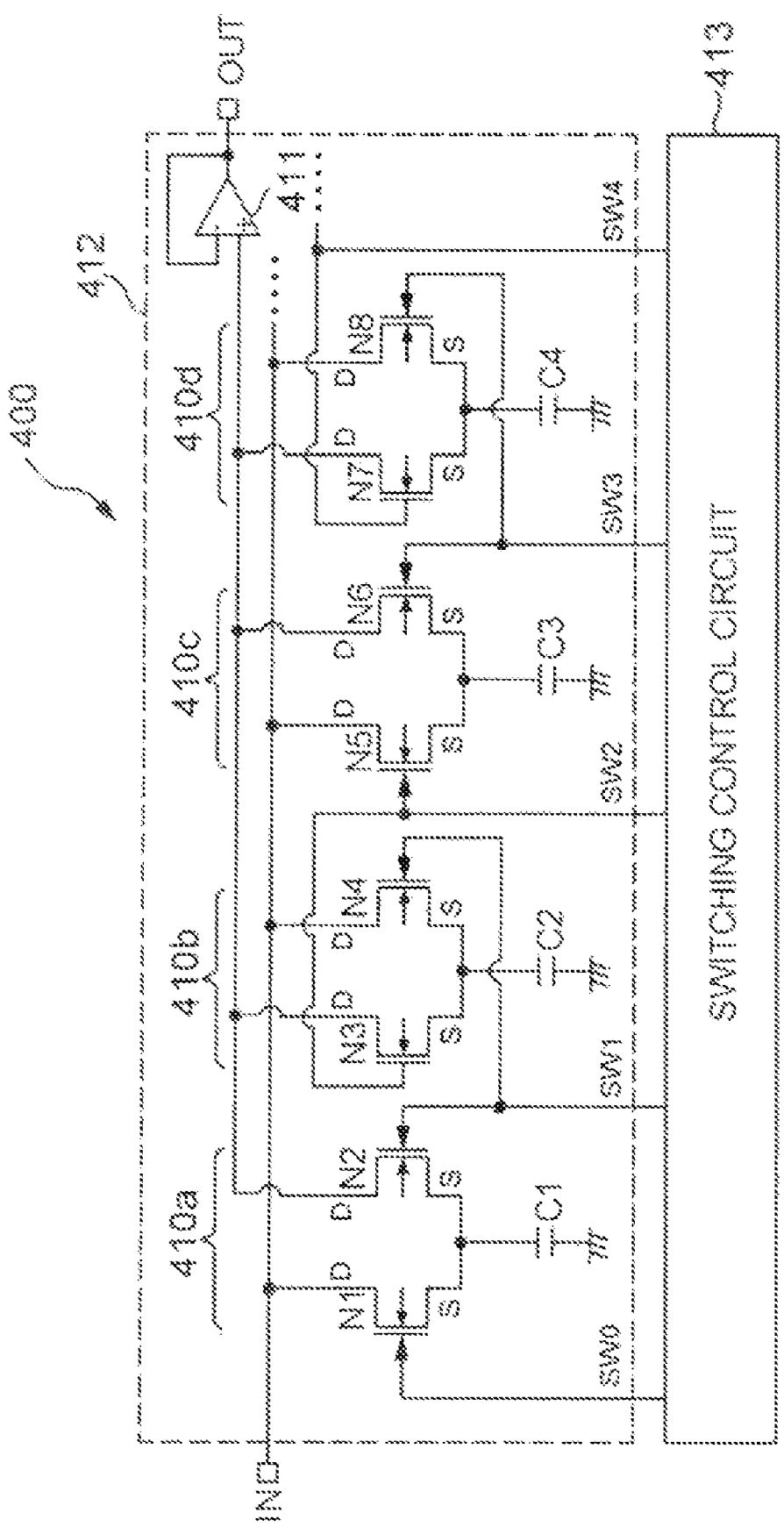
FIG. 4 shows a configuration of a 1H-delay circuit according to an embodiment of the present invention.

FIG. 4 shows an example of a circuit configuration of the 1H-delay circuit 400.

The 1H-delay circuit 400 includes a switched capacitor group 412 and a switching control circuit 413. Note that the 1H-delay circuit 400 is provided for each of the color-difference signals B-Y and R-Y.

The switched capacitor group 412 includes a plurality of switched capacitor units, the number of which depends on the length of 1H period, each of the switched capacitor units having: a charging MOS transistor and a discharging MOS transistor; and a capacitive element which is connected to sources of the charging and discharging MOS transistors and which is charged/discharged by turning on/off gates of the charging and discharging MOS transistors. A plurality of the switched capacitor units are connected such that a pair of input signals IN (color-difference signals B-Y and R-Y) are input in common to each of drains of the charging MOS transistors and such that the capacitive elements are charged, and the capacitive elements are discharged to allow output signals OUT to be output from each of drains of the discharging MOS transistors, the output signals OUT (color-difference signals B-Y and R-Y) being delayed by 1H period from the input signals IN.

Note that with respect to the switched capacitor group 412 shown in FIG. 4, NMOS transistors (N1 to N8) are employed as the charging and discharging MOS transistors, and so-called switched capacitor units (410a to 410d) are employed as the switched capacitor units. Note that the switched capacitor units (410a to 410d) are provided by the number which depends on the length of 1H period. If 1H period is "64 μsec" and delay time of each of the switched capacitor units (410a to 410d) is "0.25 μsec", then the number of steps of the switched capacitor units (410a to 410d) required is "257 steps".

For example, the switched capacitor unit 410a includes an NMOS transistor N1 acting as the charging MOS transistor, an NMOS transistor N2 acting as the discharging MOS transistor, and a single capacitive element C1. Source electrodes of both the NMOS transistors N1 and N2 are connected in common, and to their common connection part, is the capacitive element C1 connected. An input signal is input to a drain electrode of the NMOS transistor N1 so that the NMOS transistor N2 is turned off when the NMOS transistor N1 is turned on, to thereby allow the capacitive element C1 to properly be charged in response to the input signal IN. On the contrary, the NMOS transistor N1 is turned off when the NMOS transistor N2 is turned on so that the capacitive element C1 is properly discharged, to thereby acquire an output signal OUT from the drain electrode of the NMOS transistor N2.

Note that similar configurations and operations apply to the switched capacitor units 410b to 410d following the switched capacitor unit 410a. That is, common connection is made among the drain electrodes of the NMOS transistors N1, N4, N5, and N8 acting respectively as the charging MOS transistors of the switched capacitor units 410a to 410d so that the input signal IN is input in sequence to the switched capacitor units 410a to 410d. Common connection is made among a non-inverting input terminal of a voltage follower 411 and the drain electrodes of the NMOS transistors N2, N3, N6, and N7 acting respectively as the discharging MOS transistors of the switched capacitor units 410a to 410d so that the output signal OUT which is delayed from the input signal IN by 1H period is acquired in sequence from each of the switched capacitor units 410a to 410d.

The switching control unit 413 is an embodiment of the "switching control unit" of the present invention. That is, the switching control circuit 413 performs on/off control of the gate of each of the NMOS transistors N1 to N8 included in the switched capacitor units 410a to 410d, to cause each of the capacitive elements C1 to C4 of the switched capacitor units 410a to 410d to be charged in sequence based on the input signal IN. Upon the sequential charge of the capacitive elements C1 to C4, any one of the capacitive elements C1 to C4 which have been charged one switching cycle before, is discharged to allow each of the switched capacitor units 410a to 410d to output the output signal OUT in sequence.

Note that the switching control circuit 413 may be configured with, e.g., a shift register including D-flip-flop elements in multi-stage connection. Each time a shift clock signal SCK having the period of switching cycle of the NMOS transistors N1 to N8 set therein is received, the switching control circuit 413 shifts one-shot pulse of the trigger signal T (serial input signal) in sequence, thereby generating switching signals SW0 to SW4 for sequentially turning on/off the NMOS transistors N1 to N8.

<Operation of 1H-Delay Circuit>

An example of operation of the 1H-delay circuit 400 shown in FIG. 4 will be described on the basis of timing chart shown in FIG. 5.

First, the switching control circuit 413 outputs switching signals SW0 to SW4 that shift from low to high in sequence, for each period of time T0 to T1, time T1 to T2, . . . , and time T4 to T5 (see (B) to (F) of FIG. 5). Note that each period of time T0 to T1, time T1 to T2, . . . , and time T4 to T5 defines the period of switching cycle of the NMOS transistors N1 to N8. Since the period of switching cycle of the NMOS transistors N1 to N8 is set to 1H period that is delay time of the input signal IN, each period of time T0 to T1, time T1 to T2, . . . , and time T4 to T5 corresponds to the 1H period.

Next, in the switched capacitor group 412, it is assumed that input signals IN (color-difference signals R-Y and B-Y) are input to the switched capacitor units 410a to 410d. Note that the level of the input signals IN is assumed to vary to D0 in the period of time T0 to T1, to D1 in the period of time T1 to T2, . . . , and to D5 in the period of time T4 to T5 (see (A) of FIG. 5).

First, during the period of time T0 to T1, only the switching signal SW0 of the switching signals SW0 to SW4 input from the switching control circuit 413 is at high, with the other switching signals SW1 to SW4 remaining at low (see (B) to (F) of FIG. 5). Thus, in the period of time T0 to T1, the NMOS transistor N1 of the switched capacitor unit 410a is turned on, while all the remaining NMOS transistors N2 to N8 are turned off (see (G) to (K) of FIG. 5). For this reason, during the period of time T0 to T1, there is formed a charging path of the NMOS transistor N1 and the capacitive element C1 in the switched capacitor unit 410a so that the capacitive element C1 is charged with electric charge corresponding to the level D0 of the input signal IN, to hold information of the level D0 of the input signal IN (see (L) of FIG. 5).

Next during the period of time T1 to T2, only the switching signal SW1 of the switching signals SW0 to SW4 input from the switching control circuit 413 is at high, with the other switching signals SW0 and SW2 to SW4 remaining at low (see (B) to (F) of FIG. 5). Thus, in the period of time T1 to T2, the NMOS transistor N2 of the switched capacitor unit 410a and the NMOS transistor N4 of the switched capacitor unit 410b are turned on, while all the remaining NMOS transistors N1, N3 and N5 to N8 are turned off (see (G) to (K) of FIG. 5). For this reason, during the period of time T1 to T2, there is formed a discharging path of the NMOS transistor N2 and the capacitive element C1 in the switched capacitor unit 410a so that electric charge held on the capacitive element C1 is discharged, whereupon the level D0 of the input signal IN is read from the capacitive element C1 and is input to the non-inverting input terminal of the voltage follower 411. This results in output of the input signal IN of the level D0 from the voltage follower 411 (see (P) of FIG. 5). During the period of time T1 to T2, there is formed a charging path of the NMOS transistor N4 and the capacitive element C2 in the switched capacitor unit 410b so that the capacitive element C2 is charged with electric charge corresponding to the level D1 of the input signal IN to hold information of the level D1 of the input signal IN (see (M) of FIG. 5).

Afterward, similar operations are performed in the periods of time T2 to T3, time T3 to T4, and time T4 to T5 as well.

<Layout Designing of Switched Capacitor Group>

Figure 6:
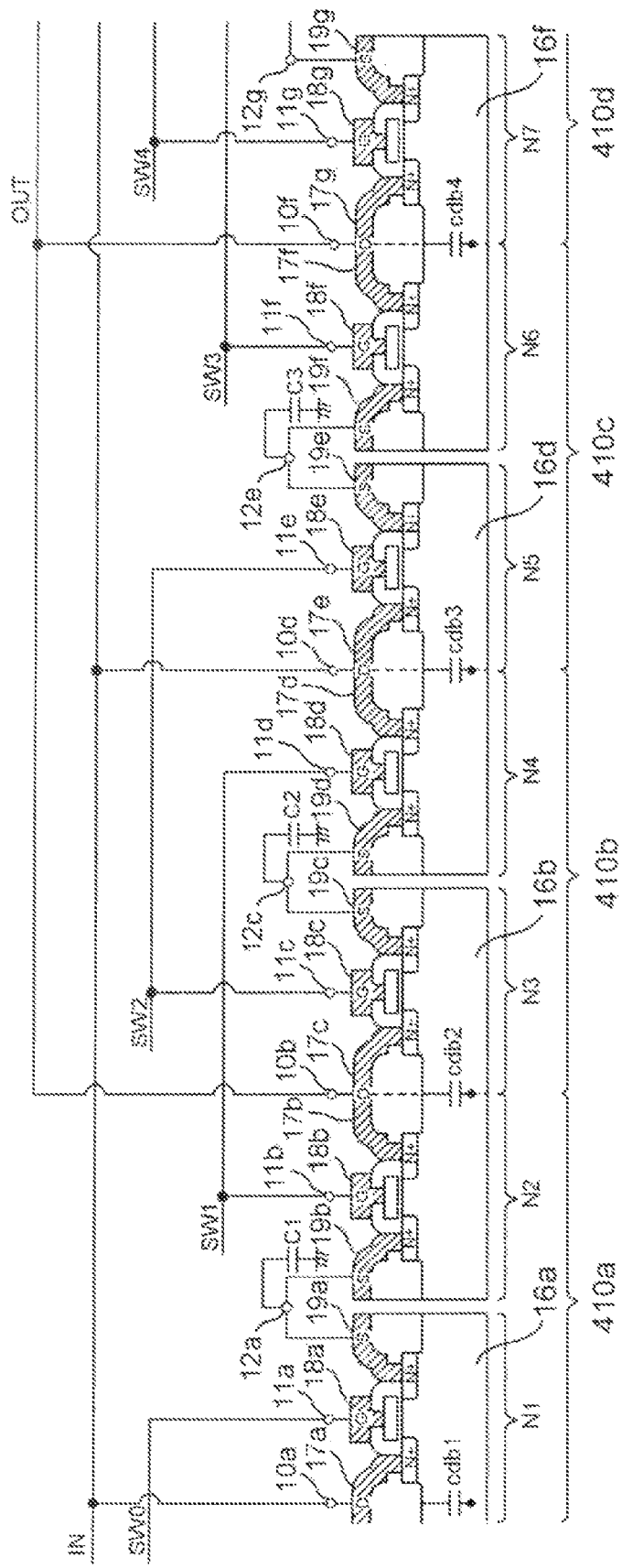
FIG. 6 shows a layout and various connections of a switched capacitor group according to an embodiment of the present invention.
Figure 12:
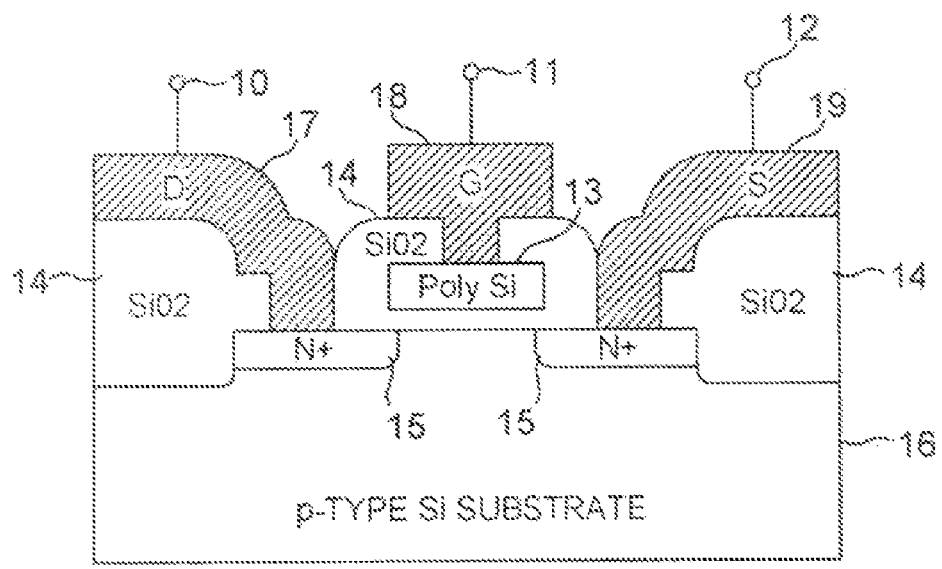
FIG. 12 shows a general sectional structure of an NMOS transistor.
Figure 13:
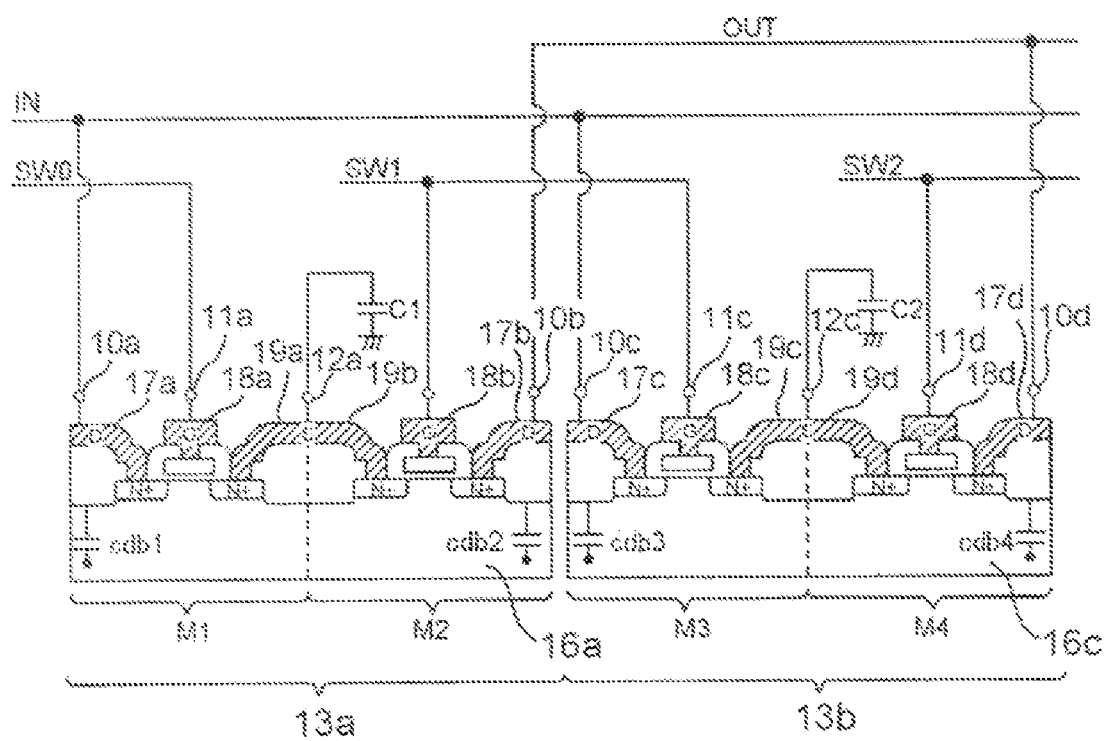
FIG. 13 shows a layout and various connections of a switched capacitor circuit making up a conventional delay circuit.

FIG. 6 is a diagram for explaining, using the general sectional structure of the NMOS transistor shown in FIG. 12, a layout and various connections of the NMOS transistors N1 to N8 of the switched capacitor group 412 shown in FIG. 4 according to the present invention. Note that although p-type silicon substrates 16a, 16b, 16d, and 16f are shown separately, they are formed on the same silicon wafer.

First, in the switched capacitor unit 410a, the NMOS transistor N1 has a so-called well-type sectional structure. A gate 18a is formed on the p-type silicon substrate 16a via silicon dioxide (SiO$_2$) for gate insulating film, etc., the gate 18a having a gate electrode 11a extending therefrom. On the p-type silicon substrate 16a is formed an n+ region (region with a high n-type impurity density), on top of which a drain 17a and a source 19a are formed. The drain 17a and the source 19a have a drain electrode 10a and a source electrode 12a, respectively extending therefrom. A switching signal SW0 is input from the switching control circuit 413 to the gate electrode 11a so that an input signal IN is input to the drain electrode 10a. The capacitive element C1 is connected to a common source electrode 12a of the NMOS transistors N1 and N2. On the other hand, the NMOS transistor N2 has a drain 17b, a gate 18b, and a source 19b formed on the p-type silicon substrate 16b shared by the NMOS transistor N3, with a drain electrode 10b, a gate electrode 11b, and a source electrode 12a extending from the drain 17b, the gate 18b, and the source 19b, respectively. Note that the source electrode 12a is common to the NMOS transistors N1 and N2. A switching signal SW1 is input from the switching control circuit 413 to the gate electrode 11b, and an output signal OUT is output from the drain electrode 10b.

Next, in the switched capacitor unit 410b, the NMOS transistor N3 has a drain 17c, a gate 18c, and a source 19c formed on the p-type silicon substrate 16b, with a drain electrode 10b, a gate electrode 11c, and a source electrode 12c, extending from the drain 17c, the gate 18c, and the source 19c, respectively. Note that the drain electrode 10b is common to the NMOS transistors N2 and N3. A switching signal SW2 is input from the switching control circuit 413 to the gate electrode 11c, and the output signal OUT is output from the drain electrode 10b. A capacitive element C2 is connected to the source electrode 12c common to the NMOS transistors N3 and N4. On the other hand, the NMOS transistor n4 has a drain 17d, a gate 18d, and a source 19d formed on the p-type silicon substrate 16d shared by the NMOS transistor N5, with a drain electrode 10d, a gate electrode 11d, and the source electrode 12c extending from the drain 17d, the gate 18d, and the source 19d, respectively. Note that the source electrode 12c is common to the NMOS transistors N3 and N4. The switching signal SW1 is input from the switching control circuit 413 to the gate electrode 11d, and an input signal IN is input to the drain electrode 10d.

Next, in the switched capacitor unit 410c, the NMOS transistor N5 has a drain 17e, a gate 18e, and a source 19e formed on the p-type silicon substrate 16d, with a drain electrode 10d, a gate electrode 11e, and a source electrode 12e extending from the drain 17e, the gate 18e, and the source 19e, respectively. Note that the drain electrode 10d is common to the NMOS transistors N4 and N5. The switching signal SW2 is input from the switching control circuit 413 to the gate electrode 11e, and the input signal IN is input to the drain electrode 10d. A capacitive element C3 is connected to the source electrode 12e common to the NMOS transistors N5 and N6. On the other hand, the NMOS transistor N6 has a drain 17f, a gate 18f, and a source 19f formed on the p-type silicon substrate 16f shared by the NMOS transistor N7, with a drain electrode 10f, a gate electrode 11f, and a source electrode 12e extending from the drain 17f, gate 18f, and source 19f, respectively. Note that the source electrode 12e is common to the NMOS transistors N5 and N6. A switching signal SW3 is input from the switching control circuit 413 to the gate electrode 11f, and the output signal OUT is output from the drain electrode 10f.

By the way, with respect to the two adjacent switched capacitor units 410a and 410b, there are adjacently disposed the NMOS transistor N2 acting as a discharging MOS transistor of the switched capacitor unit 410a and the NMOS transistor N3 acting as a discharging MOS transistor of the switched capacitor unit 410b. The disposition is further made such that the drains 17b, 17c of the NMOS transistors N2 and N3 are common. In the same manner, with respect to the two adjacent switched capacitor units 410b and 410c, there are adjacently disposed the NMOS transistor N4 acting as a charging MOS transistor of the switched capacitor unit 410b and the NMOS transistor N5 acting as a charging MOS transistor of the switched capacitor unit 410c. The disposition is further made such that the drains 17d, 17e of the NMOS transistors N4 and N5 are common.

As a result, the switched capacitor units 410a, 410b, and 410c have as their drain-to-substrate parasitic capacitance Cdb a parasitic capacitance Cdb1 existing between the drain 17a of the NMOS transistor N1 and the p-type silicon substrate 16a, a parasitic capacitance Cdb2 existing between the drain (17b, 17c) common to the NMOS transistors N2 and N3 and the p-type silicon substrate 16b, a parasitic capacitance Cdb3 existing between the drain (17d, 17e) common to the NMOS transistors N4 and N5 and the p-type silicon substrate 16d, and a parasitic capacitance Cdb4 existing between the drain (17f, 17g) common to the NMOS transistors N6 and N7 and the p-type silicon substrate 16f. Note that the parasitic capacitances Cdb1 and Cdb3 appear on the input side of the switched capacitor group 412, and that the parasitic capacitances Cdb2 and Cdb4 appear on the output side of the switched capacitor group 412.

By designing the layout of the switched capacitor group 412 in this manner, all the NMOS transistors N1 to N8 are not subjected to occurrence of the drain-to-substrate parasitic capacitance Cdb. That is, with respect to the two adjacent switched capacitor units, by disposing the two NMOS transistors N2 and N3 both acting as discharging MOS transistors so as to have the drain in common, and by disposing the two NMOS transistors N4 and N5 both acting as charging MOS transistors so as to have the drain in common, the drain-to-substrate parasitic capacitance Cdb in the entire switched capacitor group 412 can accordingly be reduced. This makes it possible to avoid dulling of final output waveforms of the switched capacitor group 412 and deterioration in the delay characteristics of the 1H-delay circuit 400.

Figure 7:
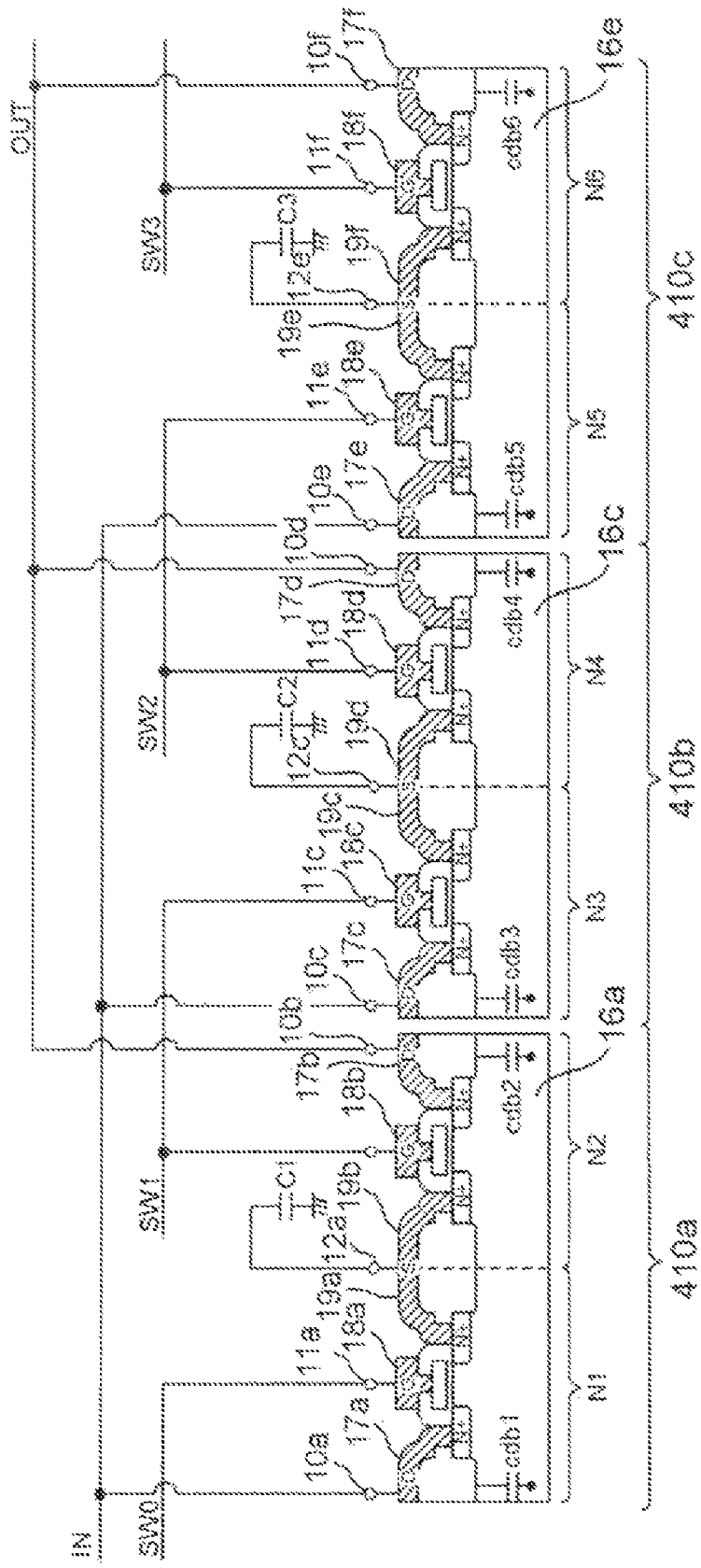
FIG. 7 shows a layout and various connections of a switched capacitor group in the case of the conventional art.
Figure 8:
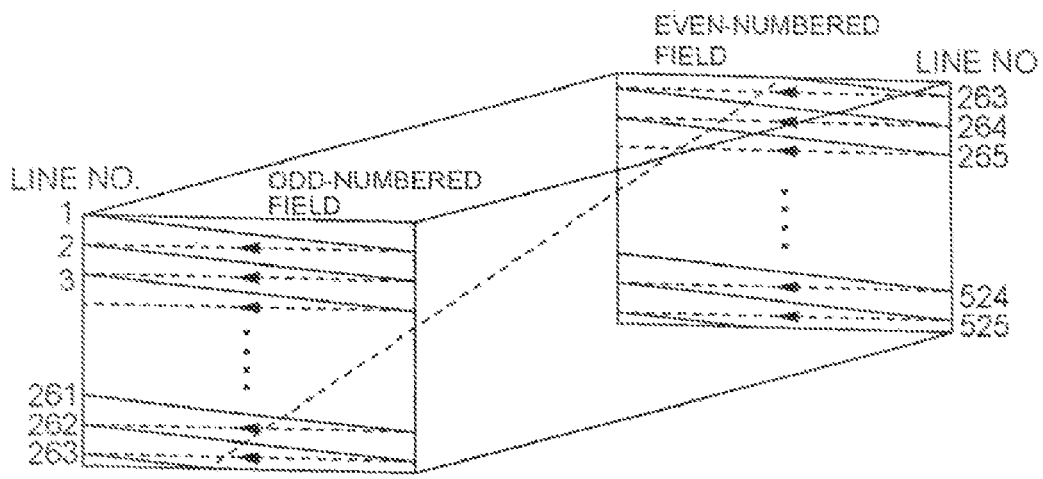
FIG. 8 is an explanatory diagram of interlaced scanning.
Figure 9:
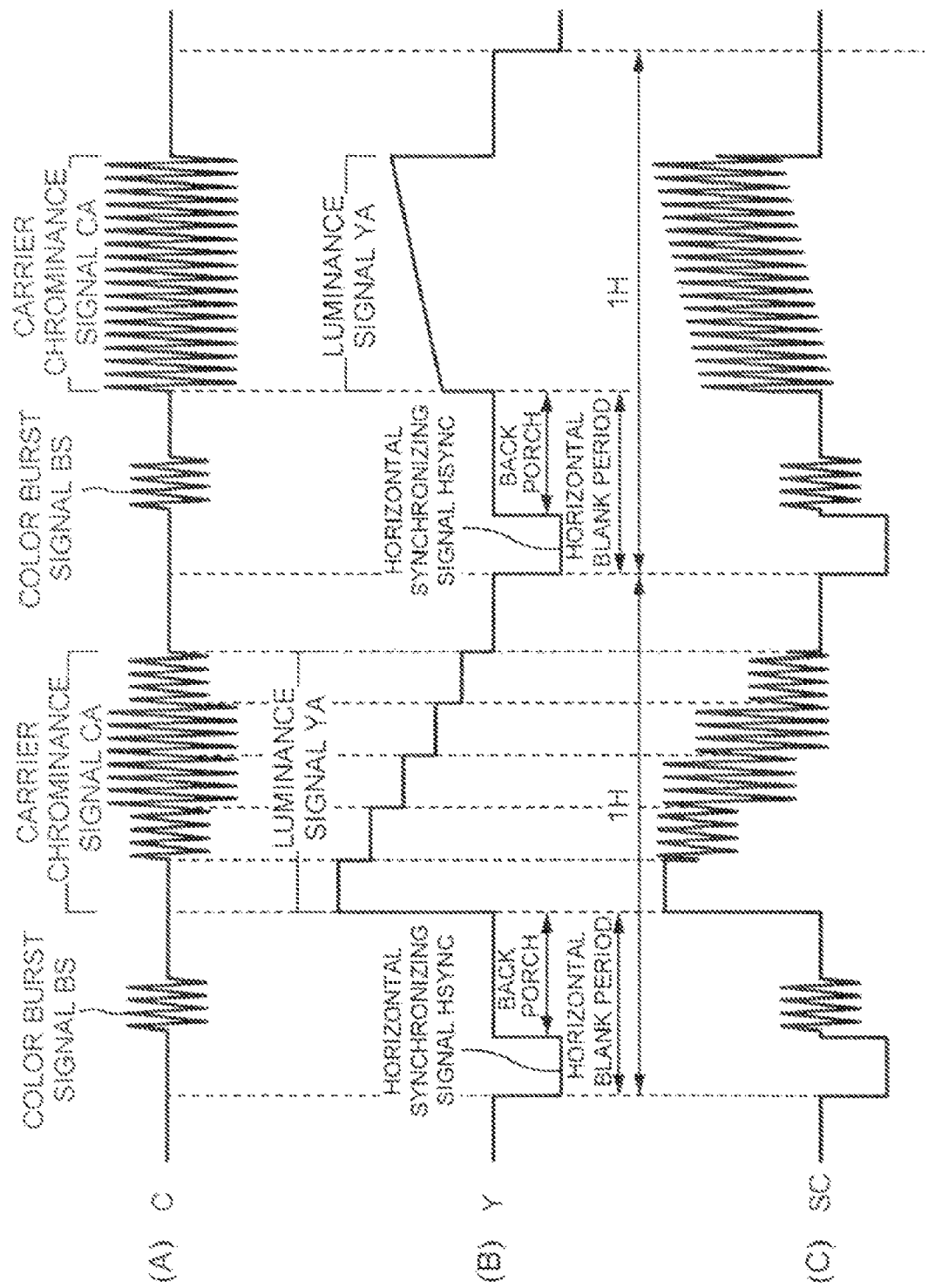
FIG. 9 shows examples of waveforms of a chroma signal C, a luminance signal Y, and a composite signal SC.

Note that FIG. 7 shows a conventional layout and conventional various connections of the switching capacitor group 412 shown in FIG. 4 according to the present invention. The conventional layout differs from the layout according to the present invention in that, for example, with respect to the switched capacitor unit 410a, the source 19a of the NMOS transistor N1 acting as a charging MOS transistor and the source 19b of the NMOS transistor N2 acting as a discharging MOS transistor are common. As a result, the conventional layout differs from the layout according to the present invention in that with respect to a single switched capacitor unit 410a, there exist for each NMOS transistor a parasitic capacitance Cdb1 between the drain 17a of the NMOS transistor N1 and the p-type silicon substrate 16a as well as a parasitic capacitance Cdb2 between the drain 17b of the NMOS transistor N2 and the p-type silicon substrate 16a.

Although the embodiment of the present invention has hereinabove been described, the above embodiment is intended to facilitate the understanding of the present invention but not to be construed as limiting the present invention. The present invention can variously be changed or modified without departing from its spirit and encompasses equivalents thereof.

What is claimed is:

1. A delay circuit acquiring an output signal delayed from an input signal, comprising:
    a switched capacitor group that includes a plurality of switched capacitor units, wherein
        each of the plurality of switched capacitor units has a charging MOS transistor and a discharging MOS transistor, and a capacitive element which is connected to sources of the charging and the discharging MOS transistors and which is charged/discharged by turning on/off gates of the charging and the discharging MOS transistors, and wherein
        the plurality of switched capacitor units are connected such that the input signal is input in common to each of drains of the charging MOS transistors and such that the capacitive elements are charged as well as such that the capacitive elements are discharged to allow the output signal to be output from each of drains of the discharging MOS transistors; and
    a switching control unit that
        performs on/off control of each of gates of the charging and the discharging MOS transistors, to cause each of the capacitive elements to be charged in sequence based on the input signal, and that,
        upon causing the each of the capacitive elements to be charged in sequence based on the input signal, causes the capacitive element charged last time to be discharged, to allow the output signal to be output in sequence, wherein
    with respect to the two adjacent switched capacitor units of the plurality of switched capacitor units, the respective charging MOS transistors are adjacent to each other and the respective discharging MOS transistors are adjacent to each other, and drains of the respective charging MOS transistors are common and drains of the respective discharging MOS transistors are common.

2. A video signal processing circuit demodulating a luminance signal and a chroma signal based on a video signal of television broadcasting having three-primary-color information on colors captured as an image, further demodulating the chroma signal into two color-difference signals in the course of color demodulation processing of the chroma signal in parallel with luminance signal processing of the luminance signal, and regenerating the three-primary-color information of the video signal of composite form, based on the luminance signal and the two color-difference signals, the video signal processing circuit comprising:
    a switched capacitor group that includes a plurality of switched capacitor units, wherein
        each of the plurality of switched capacitor has a charging MOS transistor and a discharging MOS transistor, and a capacitive element which is connected to sources of the charging and the discharging MOS transistors and which is charged/discharged by turning on/off gates of the charging and the discharging MOS transistors, and wherein
        the plurality of switched capacitor units are connected such that the demodulated color-difference signal is input in common to each of drains of the charging MOS transistors and such that the capacitive elements are charged as well as such that the capacitive elements are discharged to allow a signal to be output from each of drains of the discharging MOS transistors, the signal being delayed from the color-difference signal by 1H period;
    a switching control unit that
        performs on/off control of each of gates of the charging and the discharging MOS transistors, to cause each of the capacitive elements to be charged in sequence based on the color-difference signal, and that,
        upon causing the each of the capacitive elements to be charged in sequence based on the color-difference signal, causes the capacitive element charged last time to be discharged, to allow a signal to be output in sequence, the signal being delayed from the color-difference signal by 1H period;
    an adder that adds together the color-difference signals before and after the 1H-period delay; and
    a matrix circuit that regenerates the three-primary-color information based on the result of adding performed by the adder and on the luminance signal subjected to the luminance signal processing, wherein
    with respect to the two adjacent switched capacitor units of the plurality of switched capacitor units, the respective charging MOS transistors are adjacent to each other and the respective discharging MOS transistors are adjacent to each other, and drains of the respective charging MOS transistors are common and drains of the respective discharging MOS transistors are common.

3. The video signal processing circuit of claim 2, wherein the video signal is a signal conforming to PAL (Phase Alternation by Line) system or SECAM (SEquential Couleur A Memoire) system.

4. The video signal processing circuit of claim 2, wherein the video signal processing circuit is a circuit formed by BiCMOS process.

* * * * *